US012591045B2

(12) United States Patent
Stojetz et al.

(10) Patent No.: US 12,591,045 B2
(45) Date of Patent: Mar. 31, 2026

(54) DEVICE AND METHOD FOR PROJECTING A PLURALITY OF RADIATION POINTS ONTO AN OBJECT SURFACE

(71) Applicant: OSRAM Opto Semiconductors GmbH, Regensburg (DE)

(72) Inventors: Bernhard Stojetz, Wiesent (DE); Harald Koenig, Bernhardswald (DE); Alfred Lell, Maxhütte-Haidhof (DE); Muhammad Ali, Cambridgeshire (GB)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 1235 days.

(21) Appl. No.: 17/438,727

(22) PCT Filed: Mar. 13, 2020

(86) PCT No.: PCT/EP2020/056775
§ 371 (c)(1),
(2) Date: Sep. 13, 2021

(87) PCT Pub. No.: WO2020/187724
PCT Pub. Date: Sep. 24, 2020

(65) Prior Publication Data
US 2022/0128662 A1     Apr. 28, 2022

(30) Foreign Application Priority Data

Mar. 15, 2019     (DE) ...................... 10 2019 106 674.3

(51) Int. Cl.
*H01S 5/40*          (2006.01)
*G01S 7/481*         (2006.01)
(Continued)

(52) U.S. Cl.
CPC .......... *G01S 7/4815* (2013.01); *G01S 7/4817* (2013.01); *G01S 7/497* (2013.01); *G01S 17/931* (2020.01);
(Continued)

(58) Field of Classification Search
CPC .. H01S 5/0087; H01S 5/02469; H01S 5/4031; H01S 5/405; H01S 5/4093;
(Continued)

(56) References Cited

U.S. PATENT DOCUMENTS 6,621,609 B1     9/2003   Conemac
6,869,185 B2     3/2005   Kaminsky et al.
(Continued)

FOREIGN PATENT DOCUMENTS

CN          101278232 A      10/2008
CN          103869590 A       6/2014
(Continued)

OTHER PUBLICATIONS

Hui, H. "Application of wavelength conversion device in projection light source system," High-tech, China Academic Journal Electronic Publishing House, Feb. 2017, No. 9, http://www.cnki.net.
(Continued)

*Primary Examiner* — Tod T Van Roy
*Assistant Examiner* — Delma R Forde
(74) *Attorney, Agent, or Firm* — MH2 Technology Law Group LLP

(57)          ABSTRACT

The invention relates to a device and a method for projecting a plurality of radiation points onto an object surface, comprising at least one radiation source for emitting electromagnetic radiation, comprising at least one beam path, via which the radiation emitted at least temporarily by the emitters is deflected in the direction of the object surface, and comprising a controller which, in order to change at
(Continued)

least one property of the emitted radiation, controls the radiation source according to a light object to be generated on the object surface. The controller is designed in such a way that at least two of the plurality of emitters of the radiation source are each individually controlled in order to change at least one property of the emitted radiation according to the light object to be generated, and at least one optical element for shaping, directing and/or converting the electromagnetic radiation is arranged in the beam path.

16 Claims, 6 Drawing Sheets

(51) Int. Cl.

| | |
|---|---|
| *G01S 7/497* | (2006.01) |
| *G01S 17/931* | (2020.01) |
| *G02B 26/10* | (2006.01) |
| *G02B 27/09* | (2006.01) |
| *H01S 5/00* | (2006.01) |
| *H01S 5/024* | (2006.01) |

(52) U.S. Cl.
CPC ....... *G02B 26/105* (2013.01); *G02B 27/0922* (2013.01); *H01S 5/0087* (2021.01); *H01S 5/02469* (2013.01)

(58) Field of Classification Search
CPC ...... H04N 9/31; H04N 9/3164; H04N 9/3129; H04N 9/3144; G02B 27/18; G02B 26/123; G02B 19/0057; G03B 21/00; G03B 21/114; G01S 7/497; G01S 7/4817; G01S 7/4815
See application file for complete search history.

(56) References Cited

U.S. PATENT DOCUMENTS

| | | | |
|---|---|---|---|
| 2004/0076203 A1 | 4/2004 | Kaminsky et al. | |
| 2007/0025406 A1* | 2/2007 | Yamada | ................ H01S 5/4025 |
| | | | 372/50.121 |
| 2007/0046176 A1 | 3/2007 | Bukesov et al. | |
| 2008/0055556 A1 | 3/2008 | Takeda et al. | |
| 2008/0259431 A1 | 10/2008 | Weichmann et al. | |
| 2010/0277782 A1 | 11/2010 | Quenzer et al. | |
| 2010/0284433 A1* | 11/2010 | Hata | .................... H04N 9/3105 |
| | | | 977/755 |
| 2013/0039374 A1 | 2/2013 | Lutgen et al. | |
| 2013/0100974 A1* | 4/2013 | Janssens | ............ G03B 21/2013 |
| | | | 362/235 |
| 2014/0160441 A1 | 6/2014 | Kim et al. | |
| 2014/0374603 A1 | 12/2014 | Farahi et al. | |
| 2018/0080816 A1* | 3/2018 | Takahashi | ............. H01S 5/0087 |
| 2018/0120559 A1 | 5/2018 | Yeoh et al. | |
| 2018/0259156 A1 | 9/2018 | Hechtfischer et al. | |
| 2019/0058871 A1 | 2/2019 | Han et al. | |
| 2019/0097722 A1* | 3/2019 | McLaurin | .......... G02B 19/0057 |
| 2020/0200363 A1* | 6/2020 | Harrison | ............ H01S 5/32341 |

FOREIGN PATENT DOCUMENTS

| | | |
|---|---|---|
| DE | 60110425 T2 | 3/2006 |
| DE | 102010012604 A1 | 9/2011 |
| DE | 102012109175 A1 | 4/2014 |
| DE | 102014216390 A1 | 2/2016 |
| JP | 2007121382 A | 5/2007 |
| WO | 2010138923 A1 | 12/2010 |
| WO | 2018213100 A1 | 11/2018 |

OTHER PUBLICATIONS

Design and Analysis of a TMS320DM643 Based Projector Color Converter_Limei CUI, Computer Knowledge and Technology, Apr. 2010, pp. 2472-2474, vol. 6, No. 10, ISSN 1009-3044.

Yukawa, M. et al., "638nm single lateral mode laser diode for Micro-Projector application," 2008 IEEE 21st International Semiconductor Laser Conference, Sorrento, Italy, 2008, pp. 73-74, doi: 10.1109/ISLC.2008.4636015. keywords: {Semiconductor lasers;Power generation;Laser modes;Laser applications;Waveguide lasers;Color;Optical waveguides}.

International Search Report (with English Translation) and Written Opinion in corresponding International Application No. PCT/EP2020/056775 mailed on Aug. 11, 2020, 22 pages.

* cited by examiner a)

b)

a)

a)

b)

DEVICE AND METHOD FOR PROJECTING A PLURALITY OF RADIATION POINTS ONTO AN OBJECT SURFACE

CROSS-REFERENCE TO RELATED APPLICATION

This patent application is a national stage entry from International Application No. PCT/EP2020/056775, filed on Mar. 13, 2020, published as International Publication No. WO 2020/187724 A1 on Sep. 24, 2020, and claims priority to German application DE 10 2019 106 674.3, filed on Mar. 15, 2019, the disclosure content of all of which is are hereby incorporated by reference.

FIELD OF THE INVENTION

The invention relates to a device and a method for projecting a plurality of radiation points onto an object surface or for emitting the plurality of radiation points, for example for the purpose of distance measurement or obstacle detection in a LIDAR system. Here, a radiation source is provided that comprises a plurality of emitters for emitting an electromagnetic radiation. The radiation emitted at least temporarily by the emitters is directed via a radiation path onto the object surface, wherein a controller is provided which, in order to change at least one property of the emitted radiation, controls the radiation source in dependence on a light object to be generated on the object surface.

BACKGROUND OF THE INVENTION

Both projectors that generate an image on a projection surface and devices that direct electromagnetic radiation specifically onto an object surface for processing the object surface are known from the prior art. Common to these devices is that electromagnetic radiation generated by a radiation source is directed with the aid of at least one optical element via a radiation path specifically onto an object surface arranged remotely from the radiation source. In particular, the known projectors for large-area image generation are comparatively large and not very energy-efficient. If lasers are used for projection, the laser diodes in particular are exposed to high stress due to the fast modulation.

Projectors or beamers currently in use that have a laser light source employ two different operating principles. On the one hand, as with LED projectors, three large-diameter planar beams in red, green and blue are generated, which are combined in a suitable manner and fed to an LCD image generator to then generate an image with optical losses. On the other hand, so-called flying spot methods are known, in which the image is written line by line, requiring three focused and collimated laser beams. In order to be able to generate a light object of high intensity and in the desired quality on a projection surface, both processes require comparatively complex optics and, in some cases, expensive mechanical devices for beam combination. Another special challenge is the image resolution expected nowadays, namely HD, QFHD or even Ultra HD. To achieve the corresponding image resolutions, high demands are regularly placed on the modulation capability of the laser diodes used, which complicates both the design of the components and the drivers.

In this context, a projector for projecting a pattern onto at least a partial area of an object surface of an object is known from DE 10 2014 216 390 A1. The projector comprises a plurality of light sources and a microlens array. The individual microlenses of the microlens array are each associated with and optically coupled to one of the light sources, so that individual pairs are formed for beam generation and beam shaping. Essential for the described technical solution is that the individual light sources are designed as lasers.

From DE 10 2012 109 175 A1, a laser diode is known which comprises a semiconductor layer sequence on a substrate, wherein the semiconductor layer sequence comprises at least one active layer configured to generate laser light, and wherein at least one filter layer is provided which is configured to scatter and/or absorb light which propagates in the semiconductor layer sequence and/or the substrate in addition to the laser light.

Based on the devices known from the prior art for the projection of radiation points onto an object surface and the thereby existing problems, the present invention is based on the object of achieving the projection of a radiation object onto an object surface with comparatively simple technical means, while at the same time enabling a high image resolution and fast image sequence. The technical solution to be specified should, in particular, be of robust design and enable operation with as little wear as possible.

Furthermore, the use of complex optics and mechanisms for beam shaping and beam directing should not be necessary. With the aid of the technical solution to be specified, it should also be possible to provide a high number of radiation or light points per unit area, whereby the radiation source in particular should be characterized by a comparatively small and compact structure. With the technical solution described in more detail below, it should also be possible in a special way to realize a projector that is easy to handle and transport and whose construction can be carried out without considerable assembly and adjustment effort.

The object described above is solved with a device according to the features of claim 1 and a method according to the features of claim 15. Advantageous embodiments of the invention are subject of the dependent claims and are explained in more detail in the following description with partial reference to the figures.

SUMMARY OF THE INVENTION

The invention relates to a device for projecting a plurality of radiation points onto an object surface, comprising at least one radiation source which comprises a plurality of emitters for emitting electromagnetic radiation. Via at least one radiation path, the radiation emitted at least temporarily by the emitters of the radiation source is directed onto the object surface, wherein a controller is provided which, in order to change at least one property of the emitted radiation, controls the radiation source in dependence on a radiation or light object to be generated on the object surface. According to the invention, the device has been further developed in such a way that at least two of the plurality of emitters of the radiation source are each individually controlled by the controller in dependence on the radiation or light object to be generated for changing at least one property of the emitted radiation, and in that at least one optical element is arranged in the radiation path for shaping, directing and/or converting the electromagnetic radiation.

The technical solution according to the invention is thus characterized first of all by the fact that a plurality of emitters is provided, preferably up to 20, up to 50, up to 100 or up to 200 light sources, which are particularly preferably in the form of laser diodes, which can be individually controlled by the controller and are arranged in a comparatively confined space. With such individually controllable light sources of a radiation source, it is possible in a comparatively simple manner to generate radiation objects with a plurality of different pixels in a short time sequence and with high resolution on an object surface, in particular a projection surface, such as a screen. In this context, it is pointed out that, depending on the radiation emitted by the emitters of the radiation source, it is possible by means of a device according to the invention either to display desired images or image sequences with high resolution on a projection surface or to process an object surface with the aid of suitable radiation.

Furthermore, according to the invention, at least one optical element is provided in the radiation path between the individual emitters of the radiation source and the object surface on which a plurality of pixels are generated, which shapes, directs and/or converts the electromagnetic radiation emitted by at least two of the plurality of emitters. For controlled directing and/or shaping of the radiation, the optical elements preferably used are microlenses, micro-opto-electro-mechanical systems, rotating mirrors, galvo scanners, and/or other suitable optical elements. Conversion of the electromagnetic radiation takes place if the at least one optical element is designed as a converter element with converter material, the converter material emitting radiation, in particular visible light, due to excitation by the incident electromagnetic radiation, the wavelength of which differs from the wavelength of the exciting electromagnetic radiation.

Of course, it is conceivable that suitable optical elements, such as microlenses, micro-opto-electro-mechanical systems, rotating mirrors and/or galvo scanners, are also used alternatively or additionally for directing and/or shaping the radiation generated by excitation, i.e. in particular red, green and/or blue light, and are arranged at an appropriate position in the radiation path.

Due to the use of a plurality of individually controllable light sources, preferably laser diodes, it is possible to generate a plurality of pixels simultaneously, e.g. for flying spot applications, so that despite an image resolution in the HD, QFHD or Ultra HD range, the control frequency of the individual pixels is significantly reduced compared to known technical solutions.

The device according to the invention can be used in connection with a LIDAR system, in particular as a component of a LIDAR system. LIDAR here stands for "light detection and ranging". In this context, the object surface may be regarded as an imaginary object surface which may, for example, be located at a distance in front of a vehicle. Backscattered radiation from an object lying in the object surface can be detected by means of an associated detector. In a manner known per se, a distance measurement to the object or an obstacle detection can be performed on the basis of detected, back-reflected radiation. When used in a LIDAR system, the wavelength of the emitted radiation is preferably in the range between 750 nm and 1200 nm.

In a special embodiment of the invention, it is provided that at least two of the plurality of emitters, particularly preferably a larger number, are part of a laser bar. In this context, laser bars offer the advantage that a very compact design of a radiation source with a plurality of different light sources is made possible at the chip or component level. The use of at least one laser bar with at least two individually controllable light sources is particularly advantageous, since individually controllable emitters of a radiation source can be combined with suitable optical elements arranged in the radiation path in a confined space. According to a special further development of the invention, each of the at least two individually controllable emitters of a radiation source is assigned to at least one optical element in the radiation path between the respective emitter and the object surface, which directs, shapes and/or converts the radiation emitted by the emitter.

In this context, it is further advantageous if a pair or unit formed by one emitter and at least one optical element each emits either red, green or blue light. Provided that a device according to the invention comprises several such pairs emitting at least partially red, green or blue or optionally yellow light, it is possible to generate arbitrary light with other colours by suitably mixing the light with the three colours of the RGB colour space. By additionally using a 4th colour, in particular yellow light, a colour triangle can be created in an improved manner. More brilliant images can be generated as a result. The additional use of a 4th colour, such as yellow, can be used in particular in connection with "Cinema" applications.

In a specific further embodiment of the invention, it is provided that at least two of the plurality of emitters are arranged spaced apart from each other and along a line in a vertical or horizontal plane. With such an arrangement of emitters of a radiation source, pixels arranged in rows can be projected onto an object surface in a preferred manner. Of course, it is also conceivable to tilt the corresponding rows as required or even to move them in such a way that corresponding rows of pixels with different orientations can be imaged on an object surface, for example on a screen. Provided that the individual rows of emitters are moved, it is further advantageous if this movement is specifically initiated with the aid of a controller unit which is preferably part of the emitter controller. In this context, it is also conceivable to arrange several layers with emitters arranged in rows one above the other, in particular by stacking corresponding layers in which the emitters are located.

Furthermore, it is advantageous if at least two of the plurality of emitters are individually controllable and electrically conductively connected to a common cathode. In this way it is possible to control a plurality of emitters of a radiation source individually and nevertheless to realize a particularly compact structure of a radiation source. The connection of a plurality of emitters to a common cathode enables in particular a particularly space-saving layered structure of laser diodes that are part of a laser bar.

In one embodiment, it is provided that at least one of the plurality of emitters emits light with a wavelength between about 380 and 490 nm. Such an emitter thus emits blue, violet or ultraviolet light which, according to a special further development, is converted with the aid of a converter element arranged in the radiation path into radiation with a wavelength deviating from the excitation radiation. Advantageously, the converter element is configured in such a way that it is excited to emit visible red, blue or green light as a result of excitation by the blue, violet or ultraviolet light emitted by the emitter. For this purpose, the converter element comprises a suitable converter material which, due to excitation by the electromagnetic radiation, emits light with a wavelength which is different from the wavelength of the electromagnetic radiation causing the excitation.

Furthermore, the converter elements are preferably configured and arranged in such a way that they emit red, green and blue light, which is subsequently mixed, so that patterns and images with different colours can be imaged on an object surface, for example a screen, using a projection device designed in this way.

According to a further development of the invention, it is provided that the object surface comprises, at least in some areas, converter material which, due to an incident radiation having a first wavelength, emits radiation having a second wavelength different from the first wavelength. In order to direct the excitation radiation specifically to the respectively required partial areas of the object surface, optical elements are arranged in the respective radiation paths between the emitters and the object surface, these being microlenses, micro-opto-electro-mechanical systems, rotating mirrors, galvo scanners and/or other elements for beam guidance. Due to the provision of converter material on different partial areas of the object surface, in this particular embodiment of the invention, different colours or colour patterns are generated directly on the object surface due to the excitation by the impingement of the excitation radiation.

In one embodiment of the invention, it is provided that at least a part of the controller is designed as belonging to an integrated circuit (IC), in particular to an application-specific integrated circuit (ASIC). Such an embodiment of the controller enables a particularly space-saving structure of a projection device, the individual emitters of the radiation source of which are individually controlled by the controller in dependence on the radiation or light object to be generated on the object surface. Preferably, the integrated circuit (IC) used in each case contains not only the controller and possibly the driver logic for the individual emitters, but also, for example, elements for converting the image signal for the plurality of emitters, such as the lasers of a laser bar, sensor technology for monitoring the radiation source and/or the individual emitters, preferably including the possibility of regulating certain parameters, such as temperature, voltage, current strength and/or optical power, and/or a digital interface, such as an HDMI interface, so that only an image signal needs to be fed in. Preferably, integrated circuits that have been applied to a silicon substrate are used, with the controller connected directly or indirectly to the emitters to be controlled. A corresponding connection can optionally comprise individual wires, bond pads and/or selectively applied and structured miniaturizations.

An efficient and space-saving arrangement of the controller provides for the integrated circuit to be arranged in or on a substrate through which heat is at least temporarily dissipated from at least one of the plurality of emitters. Such a heat conducting or heat dissipating element is also referred to as a heat sink or heat spreader.

Usually, heat is generated during the generation of light in the light sources, which has to be dissipated in order to prevent or at least minimize negative influences on the energy efficiency of the individual light sources as well as the long-term stability. According to this particular embodiment, heat is preferably dissipated via a heat sink, in particular a heat sink made of a material with a high thermal conductivity, such as silicon carbide (SiC), aluminium nitride (AlN), copper tungsten (CuW), diamond, diamond-like carbon (DLC), boron nitride (BN). The heat sink may contact one or a plurality of emitters, at least in some areas, so that heat generated at the emitters during light generation is dissipated via the heat sink. Preferably, the heat dissipated from the respective light source of a radiation source is finally supplied to a heat exchanger, in which this heat is transferred to a heat transfer medium, for example a guided air flow or water, and is dissipated by the latter to the environment.

In one embodiment of the invention, at least one of the plurality of emitters may emit light having at least one wavelength in the infrared spectral range. Thus, the device can be used in applications in the infrared spectral range.

At least one converter element with a converter material can be arranged in the radiation path, which, due to excitation by the electromagnetic radiation, emits light with a wavelength that is different from the wavelength of the electromagnetic radiation causing the excitation, wherein the converter element is configured to emit light having at least one wavelength in the infrared spectral range. Thus, infrared radiation can also be generated by conversion.

Preferably, the infrared radiation is in the near-infrared spectral range having wavelengths between 750 nm and 1 µm, preferably between 750 nm and 1.5 µm, more preferably between 750 nm and 2 µm, and even more preferably between 750 nm and 3 µm.

It may be provided that at least one of the plurality of emitters emits light having a wavelength and at least one other emitter of the plurality of emitters emits light having a different wavelength, wherein the difference between the two wavelengths is smaller than a predetermined difference value, for example 50 nm, 40 nm, 30 nm, 25 nm, 20 nm or 15 nm. The emitters can be arranged on one laser bar or on different laser bars.

For example, in an RGB projection, the blue light can consist of 445 nm or 465 nm, the green light of 525 and 545 nm, and the red light of 637 nm or 657 nm. In 3D cinema, for example, this allows the image signal of the left eye to be distinguished from that of the right eye by means of corresponding filters in the glasses, thus creating a 3D impression. On the basis of such laser bars, a particularly advantageous design of a dual-head 3D cinema can be created using so-called 6P technology.

At least two converter elements with a respective converter material may be arranged in the radiation path, wherein the respective converter material emits light having a wavelength different from the wavelength of the electromagnetic radiation causing the excitation due to excitation by the electromagnetic radiation, wherein one of the converter elements emits light having at least one wavelength, and the other converter element emits light having a different wavelength, wherein the difference between the two wavelengths is smaller than a predetermined difference value, for example 50 nm, 40 nm, 30 nm, 25 nm, 20 nm or 15 nm.

The converter elements can be illuminated by the same or different laser bars.

According to the previously described embodiments, the device can thus comprise laser bars and/or converter elements downstream of the laser bars, by means of which light with slightly different colours can be generated. For example, blue light can be generated at 450 nm and at 465 nm. The colours can be very similar for the eye of a user. By using appropriate colour filters in front of the user's eyes, one colour can be fed to one eye and the other colour to the other eye. This allows a 3D effect to be created, similar to conventional 3-D systems that use polarizing filters.

The emitters can preferably be semiconductor laser diodes. In particular, a semiconductor laser diode can be an edge-emitting laser, for example a so-called stripe laser, a ridge waveguide laser, a tapered laser or a combination thereof. The front facet as well as the back facet of such semiconductor laser diodes are formed by side surfaces of a semiconductor layer sequence and a substrate, which are preferably arranged perpendicular to the direction of extension of the semiconductor layers of the semiconductor layer sequence. The at least one active layer formed in the semiconductor layer sequence may, for example, comprise an active region which is formed by a part of the active layer and in which the laser light is generated. Depending on the configuration of the semiconductor laser diode, the semiconductor layer sequence may thus comprise an active region that comprises all or only part of the active layer. Furthermore, the semiconductor laser diode can be designed as a laser bar which comprises active regions in the active layer laterally adjacent to each other, i.e. in a direction parallel to the main extension plane of the active layer, via which laser light can be emitted during operation respectively.

For the manufacture of a semiconductor laser diode, the semiconductor layer sequence with at least one active layer can be epitaxially grown on a growth substrate. Preferably, the growth substrate may be an at least partially transparent substrate that is at least partially transparent to the light generated in the active layer during operation of the semiconductor laser diode. Preferably, the growth substrate is formed by a GaN substrate or by a sapphire substrate. Epitaxial growth can be performed, for example, by metal organic vapour phase epitaxy (MOVPE) or molecular beam epitaxy (MBE).

The semiconductor layer sequence is preferably based on a III-V compound semiconductor material. The semiconductor material is, for example, a nitride compound semiconductor material such as $AlxIn1-x-yGayN$ or a phosphide compound semiconductor material such as $AlxIn1-x-yGayP$ or also an arsenide compound semiconductor material such as $AlxIn1-x-yGayAs$, where in each case $0≤x≤1$, $0≤y≤1$ and $x+y≤1$. Here, the semiconductor layer sequence may comprise dopants as well as additional components. For the sake of simplicity, however, only the essential constituents of the crystal lattice of the semiconductor layer sequence, i.e. Al, As, Ga, In, N or P, are given, even if these may be partially replaced and/or supplemented by small amounts of additional substances.

In addition, the invention relates to a method for projecting a plurality of radiation points onto an object surface, in which a plurality of emitters of a radiation source emit electromagnetic radiation at least temporally, the radiation emitted by the emitters is directed via a radiation path onto the object surface, and with the aid of a controller the radiation source is controlled in such a way that at least one property of the emitted radiation is changed at least temporally in dependence on a radiation or light object to be generated on the object surface. According to the invention, the method has been further been developed in such a way that the controller each controls at least two of the plurality of emitters of a radiation source in such a way that at least one property of the emitted radiation is changed in dependence on the radiation or light object to be generated, and in that each of the at least two emitters is assigned to at least one optical element which is arranged in the radiation path and at least temporarily shapes, directs and/or converts the radiation emitted by the at least two emitters.

In a particular embodiment, it is provided that the controller varies a radiation power and/or a radiation intensity of the radiation emitted by at least one emitter. Preferably, the at least two individually controllable emitters of the radiation source are lasers, in particular lasers emitting blue, violet and/or ultraviolet light. However, it is equally conceivable that at least one of the plurality of emitters emits red, green or blue or optionally yellow light. This red, green and/or blue light is directed directly onto the object surface by means of at least one optical element and/or mixed depending on the desired colour.

Advantageously, the individual emitters are designed as lasers of a laser bar, which enables a particularly space-saving arrangement of a plurality of emitters in a comparatively small space. Preferably, the controller is configured in such a way that at least one of the plurality of emitters is controlled in such a way that a beam direction and/or a radiation angle of the emitted electromagnetic radiation is changed. According to this embodiment, the electromagnetic radiation is thus shaped or directed in a suitable manner directly in the area of the emitter. In a further embodiment, it is provided that the controller actuates at least one optical element arranged in the radiation path in such a way that a change, caused by the optical element, in a radiation incident on the optical element is varied. In this context, it is conceivable, for example, that a deflection mirror, a prism or a similar component is moved in order to change the type of beam influence. Advantageously, the optical elements provided in the radiation path according to the invention are controlled in such a targeted manner that the desired arrangement of pixels on the object surface can be generated at a particularly short time interval and with high image resolution. Such controllable optical elements are, for example, movable and controllable microlenses, microlens arrays, rotating mirrors and/or MOEMS.

The invention also relates to a LIDAR system comprising a device according to the invention and a detector for detecting radiation reflected back from an object.

BRIEF DESCRIPTION OF THE DRAWINGS

In the following, without limiting the general idea of the invention, the invention is explained in more detail by means of individual embodiments with reference to the figures. Thereby show.

DETAILED DESCRIPTION

Figure 1:
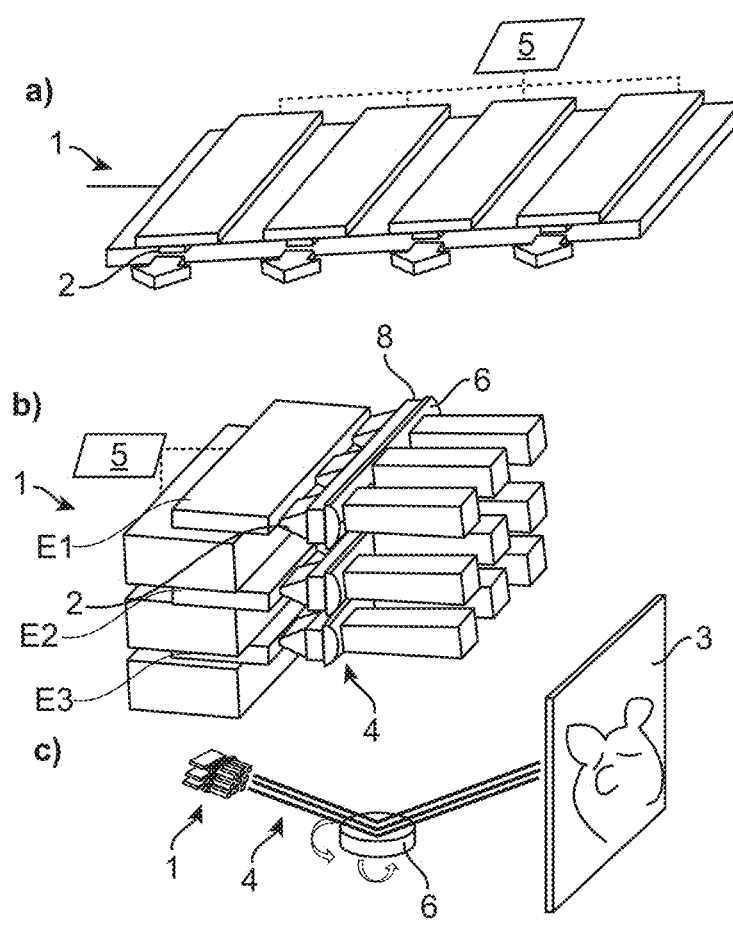
FIG. 1: an illustration of the basic structure of a projection device according to the invention.

FIG. 1 shows the basic structure of a device according to the invention for projecting a plurality of pixels onto an object surface 3, in this case a screen, which comprises a radiation source 1 with a plurality of emitters 2 and various optical elements 6, which shape, convert and direct the emitted radiation.

According to the embodiment shown, the radiation source 1 is designed as a laser bar, which comprises a plurality of laser light sources as individual emitters 2. The advantage of such laser bars 1 is primarily that a plurality of emitters 2 or light sources can be arranged in different ways in a comparatively small space.

In this context, FIG. 1a) shows a single laser bar 1 that comprises four broad-strip lasers arranged side by side in series in a single plane.

FIG. 1b) further shows an arrangement in which three laser bars 1 are arranged one above the other in parallel planes E1, E2, E3. The individual emitters 2, here lasers, of the laser bar 1 emit blue light which first impinges on a converter element 8. Such converter elements 8 comprise a converter material which, when excited by an excitation radiation, emits light at a certain wavelength different from the wavelength of the excitation radiation. In the example shown in FIG. 1b), the converter elements 8 present in the three superimposed planes E1, E2, E3 differ in that, caused by the incident excitation radiation, the converter element 8 of the uppermost plane E1 emits red light, that of the middle plane E2 green light, and that of the lowermost plane e3 blue light.

In the radiation path 4 downstream of the converter element 8, there is an optical element 6 in the form of a microlens which collimates the radiation emerging from the converter element 8 so that red, green and blue light leaves the respective microlens approximately in parallel. The radiation thus generated with the colours red, green and blue is deflected in a suitable manner, as shown schematically in FIG. 1c), with the aid of a rotating mirror (MOEMS) designed in microsystem technology as a further optical element, so that the desired image is generated on an object surface 3, which in this case is a screen.

The essential technical feature is that a controller 5 is provided which individually controls the individual emitters 2, designed as lasers, of the laser bars forming the radiation source 1, so that images, patterns or lettering with a large number of pixels can be generated on the object surface 3 in a short time sequence and with high resolution. The controller 5 also controls the rotating mirror arranged as a further optical element 6 in the radiation path 4 in such a way that the incident beams are deflected in a suitable manner and, if necessary, combined in such a way that different colours can be displayed in different partial areas of the object surface 3. The different colours are generated by suitably combining the beams, which have the colours red, green and blue characteristic of the RGB colour space.

The device shown in FIG. 1 for generating a plurality of pixels on an object surface 3 thus comprises a laser bar as radiation source 1, which can preferably comprise up to 50 laser diodes arranged in a very small space. According to the invention, the individual emitters 2, in this case the laser diodes, are individually electrically controlled in dependence on the light object to be generated on the object surface 3. With the help of such a device, it is possible, for example in a flying spot application, to generate a large number of pixels simultaneously on the object surface 3, so that despite an image resolution in the HD, QFHD or Ultra HD range, the drive frequency of the individual pixels is significantly reduced compared to known technical solutions.

The use of laser bars as radiation source 1 also offers the advantage that a particularly compact design can be realized. In particular, the combination with suitable converter elements 8 and further optical elements 6 for beam directing and/or beam shaping offers the possibility of providing a multi-channel RGB light source in a comparatively simple manner.

Preferably, collimating lenses, for example fast-axis collimating lenses (FAC) or slow-axis collimating lenses (SAC), are arranged behind the converter elements 8 as optical elements 6 for beam shaping, as shown in FIG. 1, whereby the shown compact design of a collimated RGB laser light source with up to 3×50 channels can be realized in a very small space.

If corresponding collimating lenses, in particular micro collimating lenses, and/or the converter elements 8 are applied directly to the radiation source 1, in this case the laser bar, an almost monolithically integrated device for projecting a plurality of radiation points onto an object surface 3 can thus be realized.

Figure 6:
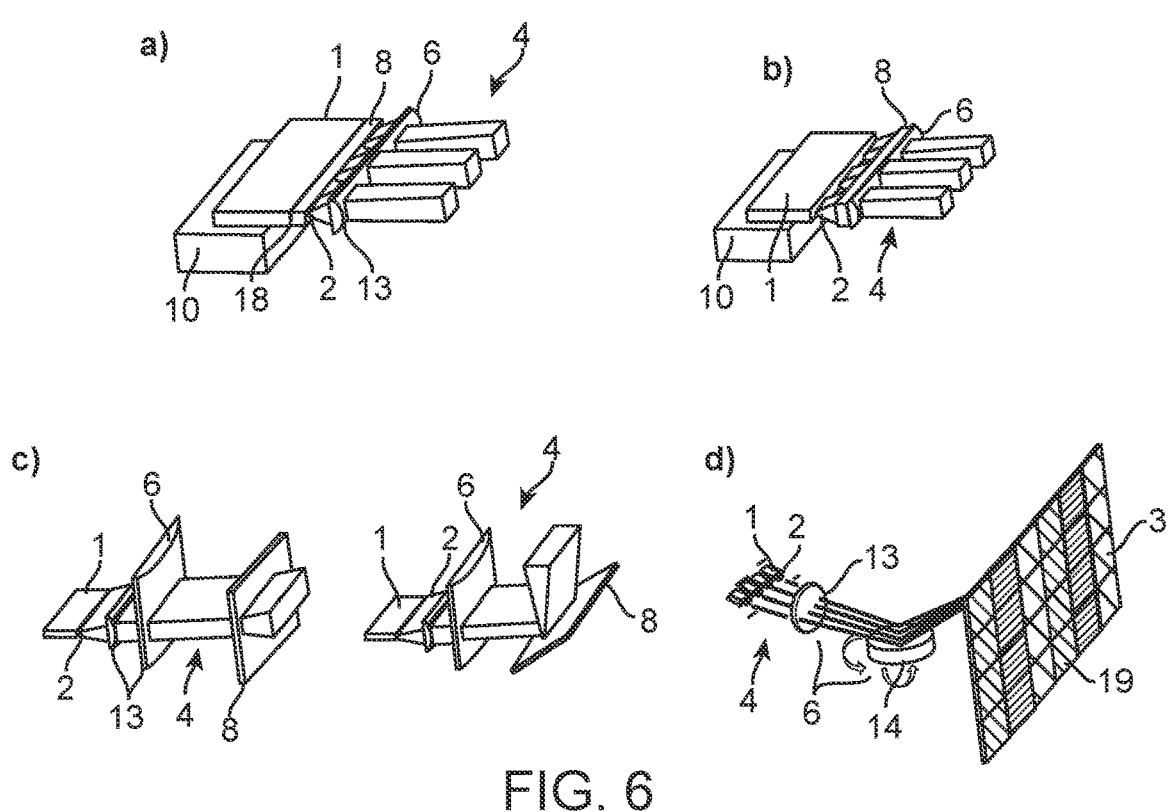
FIG. 6: different arrangements of converter elements in the radiation path.
Figure 7:
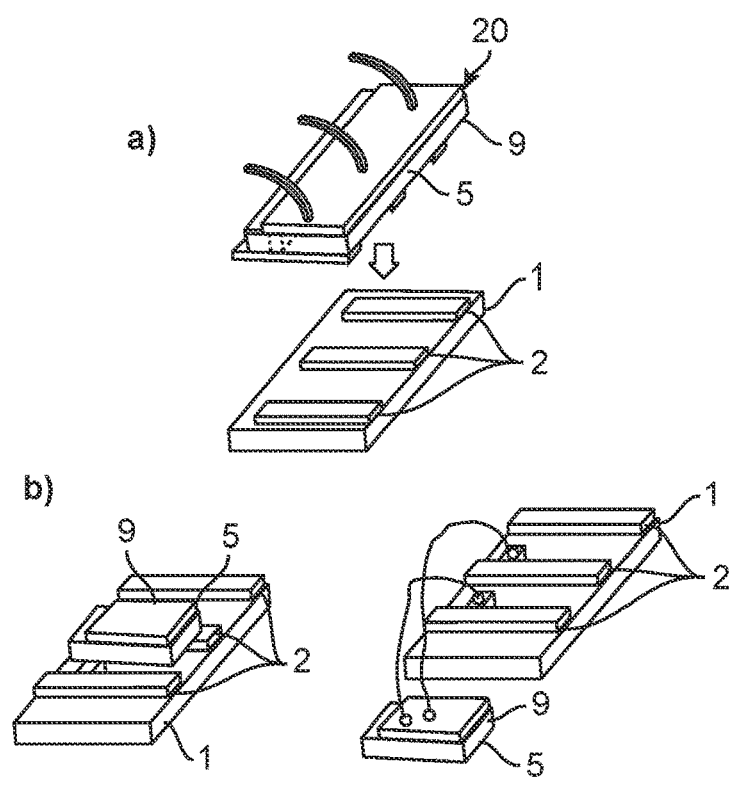
FIG. 7: variants for integrating the controller into a radiation source that can be used according to the invention.

To control the individual emitters 2 of the radiation source 1, in this case the laser diodes of a laser bar, an integrated circuit 9 (IC) mounted on a heat sink or heat spreader is used (cf. FIGS. 6 and 7). The terms heat sink and heat spreader are used herein as synonyms. Such an integrated circuit 9 can also be advantageously adapted to the respective requirements and is then also referred to as an application-specific integrated circuit.

The radiation emitted by each individual laser diode is collimated and converted if necessary. Several laser bars with differently coloured converter elements 8 can be stacked or placed next to each other, as shown in FIG. 1c). The beams are each directed onto an object surface 3, in particular a screen or canvas, by means of suitable optical elements 6, such as rotating mirrors, galvo scanners or optical elements in microsystem technology (MOEMS).

Figure 2:
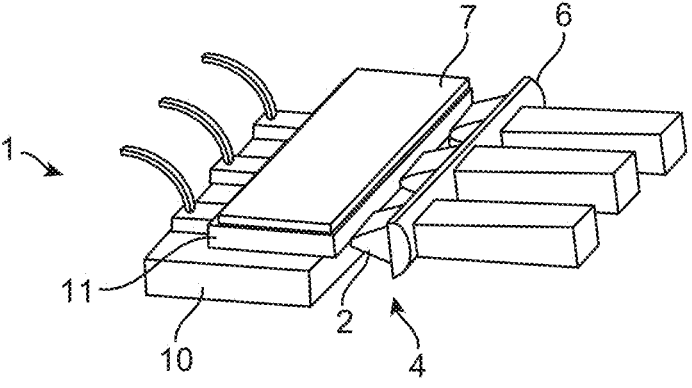
FIG. 2: an arrangement of a laser bar with the p-side on a heat sink.
Figure 3:
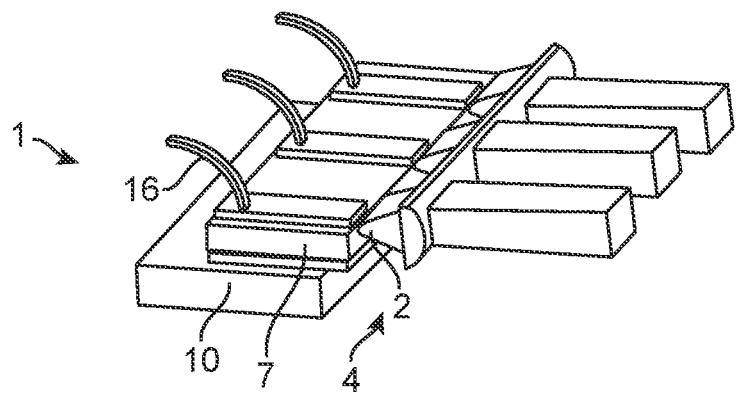
FIG. 3: an arrangement of a laser bar with the n-side on a heat sink.

FIGS. 2 and 3 show two special embodiments of a laser bar used as radiation source 1 for a projection device according to the invention. FIG. 2 shows a laser bar which comprises three individually controllable emitters 2 for the emission of blue excitation radiation and which is mounted with its p-side down on a silicon chip. In this case, the silicon chip serves as a heat spreader 10 or heat sink for dissipating the heat generated by the laser diodes during light generation. Due to better cooling, laser bars are usually mounted with the p-side facing the heat spreader 10, as shown in FIG. 2. This is the so-called p-side-down mounting. To ensure that the individual detectors 2, in this case laser diodes, remain individually controllable, a structured metallization is applied to the heat spreader 10.

FIG. 3 shows an alternative embodiment in which, in contrast to the embodiment shown in FIG. 2, the laser bar has been mounted on a heat sink or heat spreader 10 by means of so-called p-side-up mounting. Such an assembly is possible provided that a laser bar used as a radiation source is operated only with short pulses or in an interrupted, quasi-stationary mode (QCW). In this case, the individual emitters 2 are located on the side of the laser bar opposite the heat spreader 10. According to the embodiment shown in FIG. 3, the individual emitters 2 of the radiation source 1, in this case the laser diodes of the laser bar, are contacted with bonding wires. In the same way, it is possible to provide a structured metallization 11 or a structured sheet metal for contacting the individual emitters 2.

Figure 4:
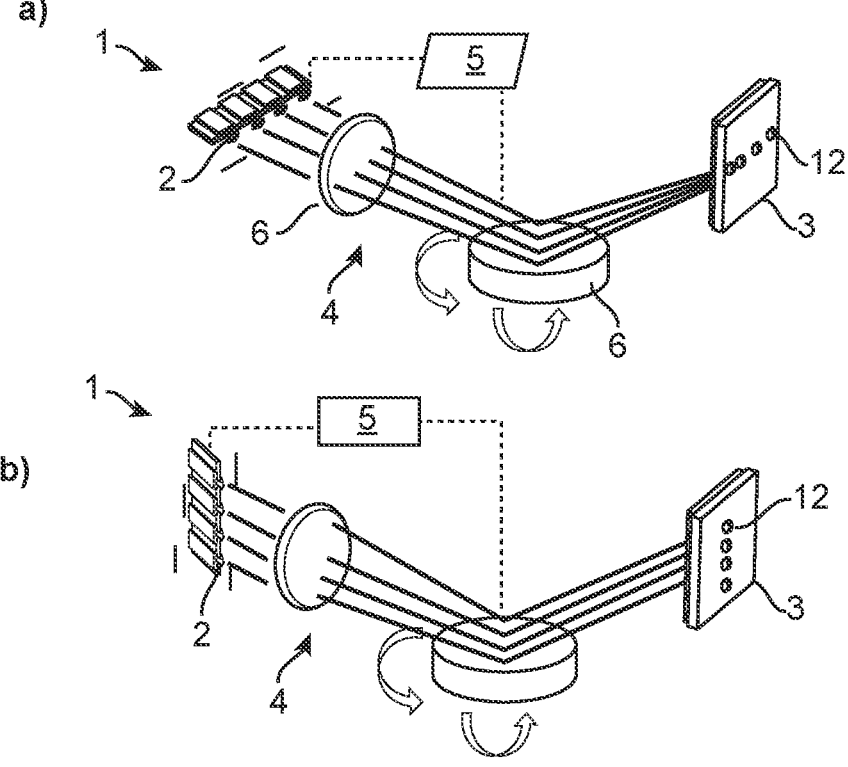
FIG. 4: variants for the simultaneous projection of rows of pixels.

FIG. 4 shows in two figures a device designed according to the invention for projecting a plurality of radiation points onto an object surface 3, in which the individual emitters 2 of the radiation source 1 are arranged in series in a plane. In accordance with the arrangement of the individual emitters 2, the projection device shown in FIG. 4 projects, at least temporally, a series of pixels 12 onto the object surface 3, which is designed here as a screen. According to the embodiment shown in FIG. 4a), both the emitters 2 and the projected pixels 12 are arranged in a horizontal row, while according to FIG. 4b) the emitters 2 and the pixels 12 on the screen are arranged in a vertical row. The individual beams emitted by the emitters 2 are collimated with the aid of a collimating lens 13 used as optical element 6 and directed onto the screen serving as object surface 3 with a MEMS-assisted rotating mirror 14 as further optical element 6, optionally with a galvo scanner. In order to be able to generate the desired patterns, images or lettering on the screen, a controller 5 is provided which, taking into account the image, pattern or lettering to be generated, specifically controls the individual emitters 2 and the rotating mirror 14.

In the further development of the invention shown in FIG. 4, each a laser bar is used as the radiation source 1 as well, which comprises a plurality of laser diodes as emitters 2. Depending on the orientation of the laser bar, the screen and the operating state of the rotating mirror 14, a plurality of horizontal or vertical pixels 12 can thus be generated simultaneously and displayed on the object surface 3. It is thus possible to display a plurality of pixels 12 with a particularly high resolution side by side in a line. Due to a projection device designed according to the invention, it is possible here that, at a given image repetition frequency, each individual laser diode does not have to be switched or pulsed as quickly or as often as is necessary with projection techniques known from the prior art.

Figure 5:
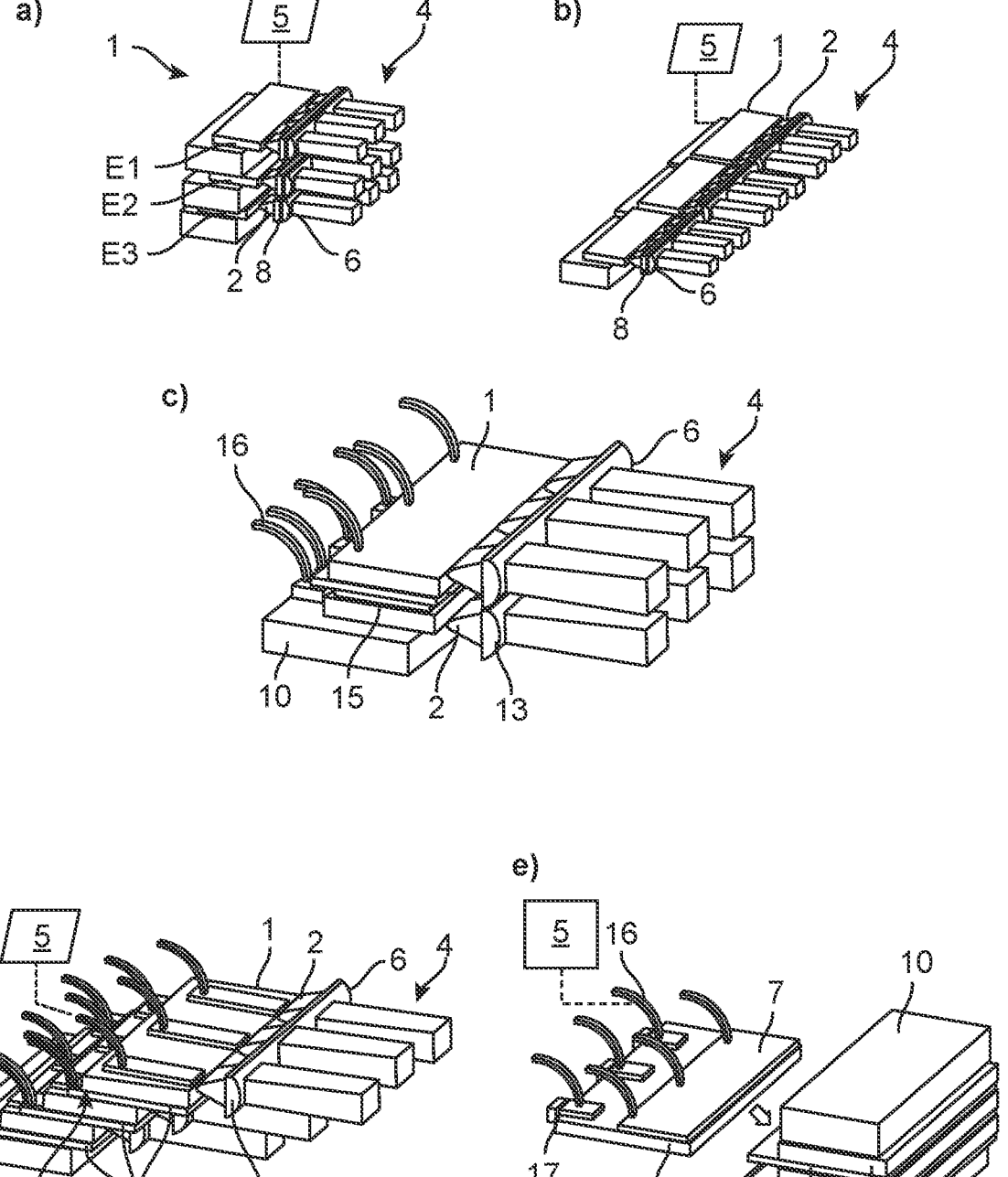
FIG. 5: different arrangements of laser bars with different emission wavelengths.

Furthermore, FIG. 5 shows in several illustrations devices designed according to the invention for the projection of pixels onto an object surface, whereby the individual emitters 2 are arranged in different ways in each case. In projection applications it is important that, insofar as laser bars are used as radiation source 1, these emit light with different wavelengths and the laser bars with different emission wavelengths are arranged as compactly as possible. In this way, pixels of different colours with high resolution can be generated with comparatively little effort. The different colours can generally be generated here either with the aid of laser bars that emit light with different wavelengths, in particular with the wavelengths characteristic of the RGB colour space, or by a blue, violet or ultraviolet pump laser that then excites suitable converter elements 8 to emit light with the corresponding colours.

FIG. 5a) first shows once again the arrangement of three laser bars already explained in connection with FIG. 1, which are arranged in three parallel planes E1, E2, E3, one above the other in the vertical direction. The electromagnetic radiation emitted by the laser diodes of the individual laser bars is converted into visible red, green or blue light with the aid of suitable converter elements 8 arranged in the respective planes. The emitted light is then collimated by collimating lenses 13 applied directly to the converter elements 8, so that red light propagates at least approximately in parallel in the upper plane E1, green light in the middle plane E2 and blue light in the lowest plane E3.

FIG. 5b) further shows a special embodiment in which the respective laser bars with the associated converter elements 8 and collimating lenses 13 are not stacked on top of each other, as shown in FIG. 5a), but are arranged next to each other.

According to FIG. 5b), a planar arrangement is thus achieved which emits red, green and blue light in different, adjacent areas. Each of the elements arranged side by side comprises a laser bar provided as a radiation source 1 with laser diodes as emitters 2, a converter element 8 which converts the excitation radiation into visible light of the desired colour, in this case red, green and blue, and a collimating lens 13 through which the radiation leaving the converter element 8 in a diverging manner is collimated.

FIG. 5c) shows an arrangement in which two laser bars are stacked on top of each other. The laser diodes of the individual laser bars, which serve as emitters 2, emit blue light that is collimated with the aid of suitable collimating lenses 13.

In the embodiment shown in FIG. 5c), the two laser bars have been joined by means of a so-called back-to-back assembly. Here, the two n-sides of the laser bars are arranged facing each other. The individual laser diodes are driven by bonding wires and the current flows off via a common cathode 7.

In addition to the previously described variant of arranging the laser bars back-to-back, the laser bars can also be stacked by arranging the respective p-side of a laser bar at the top and the n-side at the bottom. To prevent shunts and crosstalk, insulating layers 15 are provided between the n-sides of the upper laser diodes and the p-sides of the lower laser diodes. In this regard, FIG. 5d) shows a stack of laser bars in which the individual laser bars are arranged with the intervening insulating layers 15 offset from each other. The individual laser diodes serving as emitters 2 are each contacted from above by means of bonding wires 16. The insulating layers 15, which are considerably thinner than the individual laser bars, are metallized on one side, this metallization forming the cathode 7 for current dissipation.

Supplementary FIG. 5e) shows a special embodiment of a radiation source 1 which can be used to implement the invention and in which the individual laser bars are stacked without offset from one another. In this case, the insulating layers 15 arranged between the laser bars comprise contacts 17 for contacting the p- and the n-sides of the laser diodes. As can be seen from the detailed view on the left, in this particular embodiment of a stack of laser bars, the p-contacts of the individual laser diodes are guided around the insulating layer 15 on its upper side, so that both the p- and the n-contacts can be bonded or contacted on this side of the insulating layer 15.

In order to specifically cool the laser bars or laser bar stacks shown in FIG. 5, suitable heat sinks or heat spreaders 10 are introduced into the respective arrangement. In general, it is conceivable to dissipate heat from only one side of a laser bar or laser bar stack or from several sides.

FIG. 6 shows different technical solutions for converting the electromagnetic radiation emitted by the emitters 2 of a radiation source 1 into light with a different wavelength. According to the embodiment shown in FIG. 6, the radiation source 1 is again designed as a laser bar whose individual laser diodes emit blue or ultraviolet light as emitters 2. In addition to this, at least one optical element 6 for beam guidance or beam shaping and a converter element 8 with suitable converter material are each provided in the radiation path 4. The converter element 8 or the converter material located on or in the converter element is excited by the excitation radiation to emit light with a wavelength that differs from the wavelength of the excitation radiation. Depending on the converter material selected and the excitation radiation, the radiation conversion varies. Preferably, blue or ultraviolet radiation is converted into light with the colours characteristic of the RGB colour space, red, green, or blue, into white light, into light with a different colour, or into infrared radiation. It is also possible to convert infrared radiation into longer wavelength infrared radiation, for example, in order to carry out material processing procedures.

FIG. 6a) shows in this context a converter element 8 which has been applied directly to the laser mirror 18 of the laser bar. In general, it is conceivable to vapour-deposit, sputter, glue and/or bond the converter element 8 onto the laser mirror 18 or to integrate the converter element 8 into the laser mirror 18, whereby it can be useful to first integrate the converter element 8 into the laser mirror 18 and then sputter both elements together onto the emitter surface of the laser bar. The aforementioned variants are each monolithic integrated technical solutions that enable a particularly space-saving radiation source 1 whose emitters 2 can be controlled individually.

In the embodiment shown in FIG. 6a), the converter element 8 arranged directly on the laser mirror 18 is excited to emit red light by means of blue or ultraviolet excitation radiation. Furthermore, a collimating lens 13 is arranged downstream of the converter element 8 in the radiation path, which collimates the red light divergently leaving the converter element 8.

Furthermore, FIG. 6b) shows an embodiment in which the converter element 8 is arranged in front of the laser bar serving as radiation source 1 and at a distance from it. In the embodiment shown in FIG. 6b), the converter element 8 is arranged between the radiation source 1 designed as a laser bar and the additionally provided collimating lens 13, whereby the converter element 8 is applied directly to collimating lens 13.

FIG. 6c) again shows a laser bar as radiation source 1 with individual emitters 2, which emit blue or ultraviolet light. In the example shown in FIG. 6c), the radiation emitted by the individual emitters 2 is first collimated with the aid of two collimating lenses 13 and then applied to a flat converter element 8. A special feature here is that the converter element 8 is oriented differently in the radiation path 4, with the beam direction remaining unchanged (right-hand illustration) or being deflected by 90° (left-hand illustration) depending on the angle of inclination selected. According to the example shown in FIG. 6c), on the right, both a radiation conversion and a reflection of the incident radiation take place at one point of the radiation path 4.

FIG. 6d) shows a special embodiment of the invention in which the converter material 8 is located directly on the object surface 3 intended for projection, in this case a screen. The object surface 3 comprises as converter elements 8 individual converter pixels 19 which emit light of the desired colour when the excitation radiation is incident thereon. By suitable excitation of the object surface 3, the desired image or pattern is thus generated on the object surface 3.

Furthermore, FIG. 7 shows different possibilities for the design of a controller 5 according to the invention, which controls the emitters 2 of the radiation source 1 individually.

With the aid of the embodiments shown in FIG. 7, it is possible to dispense with external control electronics. Preferably, the controller 5 is at least partially integrated into an integrated circuit 9 (IC), which is preferably located on a heat sink 20.

In an advantageous manner, the controller 5 with the heat sink is mounted directly on or at the radiation source 1 designed as a laser bar.

The integrated circuit 9 preferably contains not only the controller 5 and possibly the driver logic for the individual emitters 2, but also, for example, elements for converting the image signal for the plurality of emitters 2, such as the lasers of a laser bar, sensor technology for monitoring the radiation source 1 and/or the individual emitters 2, preferably including the possibility of controlling certain parameters, such as temperature, voltage, current strength and/or optical power, and/or a digital interface, such as an HDMI interface, so that only an image signal needs to be fed in. Integrated circuits that are highly customized to individual requirements are also referred to as application-specific integrated controllers (ASIC).

FIG. 7a) contains an illustration of an embodiment in which the integrated circuit 9 with the controller 5 has a similar size as the laser bar used as radiation source 1. In this case, the heat sink 20 carrying the circuit 5 is mounted on the laser bar used as the radiation source 1. Provided that the heat sink with the controller 5 is mounted on the p-side of a laser bar (sub mount), the heat sink can be used to dissipate the heat generated at the laser diode when light is generated.

According to an alternative embodiment shown in FIG. 7b), the integrated circuit 9 with the controller 5 is significantly smaller than the laser bar and is mounted on or next to the laser bar. In this case, appropriate conductor tracks have been applied to the laser bar, whereby these can be designed as multiple layers with suitable insulation layers if required. The conductor tracks provide the electrical connection between the individual light emitting diodes and the contact points to the integrated circuit 9 with the controller 5. If required, bonding wires can also be used for contacting. Preferably, the contact points are arranged in the form of a matrix.

To achieve an even higher degree of integration, it is further generally conceivable to monolithically integrate the controller 5 into the laser bar and/or to insert it into a suitable recess of the laser bar. A complete monolithic integration of the controller 5 is also possible, in which the integrated circuit 9 with the controller 5 is formed in the semiconductor material of a laser bar. Furthermore, even the semiconductor material of the laser bar could be formed on a heat sink, on which a suitable circuit with control for the emitters is additionally structured.

Figures 8, 9:
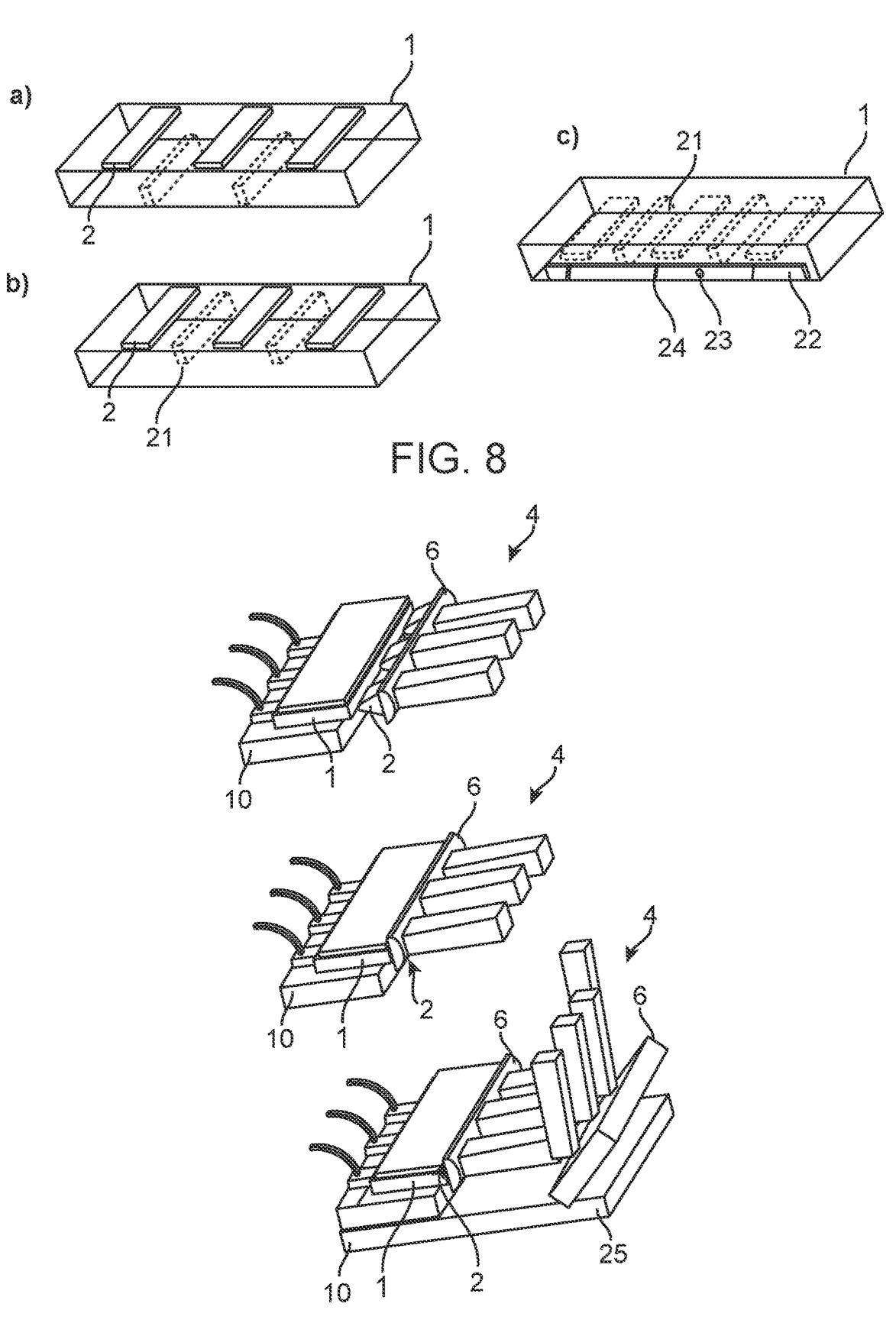
FIG. 8: various technical solutions for reducing optical crosstalk between adjacent emitters.
FIG. 9: an illustration of various designs of components in which the radiation source and optical elements are integrated.

FIG. 8 shows different variants for reducing optical crosstalk between adjacent emitters 2 of a radiation source 1, in particular between the individual laser diodes of a laser bar. According to a first particular embodiment shown in FIG. 8a), the n-side of a laser bar is structured and trenches 21 are introduced between the individual laser diodes. These trenches 21 can be at least partially filled with absorbing material, such as metals, semiconductor materials and/or insulators, if required. An alternative embodiment to this is shown in FIG. 8b), in which not the n-side but the p-side of a laser bar has been patterned. Otherwise, trenches 21 are again provided between the individual laser diodes, which can be at least partially filled with suitable absorbing material if required.

FIG. 8c) shows a further special embodiment with which the optical crosstalk between adjacent emitters 2 of a radiation source 1, in particular between the individual laser diodes of a laser bar, can at least be reduced. According to this embodiment, suitable absorbing material 23 has been applied to the output coupling facet 22 of a laser bar, with recesses 24 being provided for the light exit.

In general, it is conceivable to use the described variants for reducing optical crosstalk between adjacent emitters 2 of a radiation source 1 separately or to combine them as required.

FIG. 9 shows different possibilities for arranging optical elements 6 with respect to the radiation source 1 in projection devices designed according to the invention. Here, in FIG. 9, a microlens or microlens array is used as optical element 6 for beam shaping and is arranged in different ways in radiation path 4. In general, however, the possibility of different arrangements of at least one optical element 6 is not limited to microlenses or microlens arrays.

In FIG. 9a), collimating lenses, for example fast-axis collimating lenses or slow-axis collimating lenses, are arranged as optical elements 6 at a distance from the individual emitters 2 of the laser bar, which are designed as laser diodes. With the aid of the collimation lenses, the diverging radiation emitted by the emitters 2 is collimated. In general, it is conceivable to use individual microlenses or a microlens array that comprise both fast-axis collimating lenses and slow-axis collimating lenses with pillow-shaped individual lenses for each emitter 2.

Furthermore, FIG. 9b) shows another embodiment in which a microlens array is used that has been applied directly to the laser bar, in particular by adhesive bonding.

FIG. 9c) shows an embodiment in which in the radiation path 4 behind the emitters 2 of the radiation source 1, in this case behind the laser diodes of a laser bar, both as a first optical element 6 a microlens array for collimation of the incident radiation and a further optical element 6 for beam guidance are arranged. The microlens array is located directly on the laser bar, as in FIG. 9b), while the deflection optics for reflecting the incident radiation is attached to or integrated in a carrier substrate 25. In general, it is conceivable that the deflection optics are MEMS-assisted deflection optics. Furthermore, it is also conceivable that the deflection optics and/or another optical element is arranged even closer to the laser bar, i.e., for example, on a heat-dissipating heat sink, the heat spreader 10, or on the laser bar.

Figure 10:
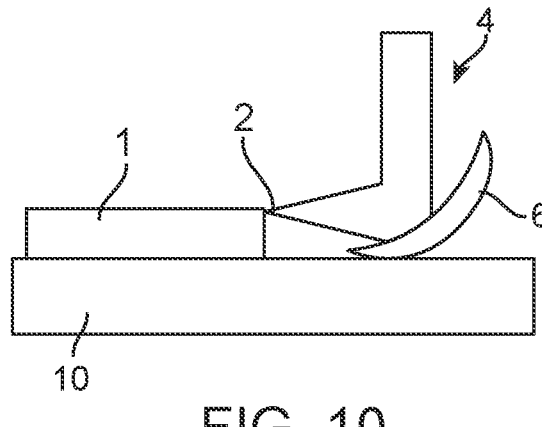
FIG. 10: a schematic representation of a component-integrated optical element, as well as FIG. 11: an illustration of the use of a projection device according to the invention for the projection of pixels onto a video screen.

As already explained in connection with FIG. 9, it is advantageous if an optical element 6 arranged in the radiation path 4 for beam guidance and/or beam shaping is integrated in a component which comprises the radiation source 1 and possibly at least partially the controller 5 of the emitters 2. In this context, FIG. 10 shows the use of micro-reflectors for beam shaping applicable to a projection device according to the invention. In this case, the optical element 6 for beam shaping and/or beam guidance is directly integrated into the component, wherein according to the embodiment shown, the optical element 6 is a micro reflector. As shown, the micro reflector is machined out of the heat spreader 10, so that at least almost monolithic integration is realized.

Figure 11:
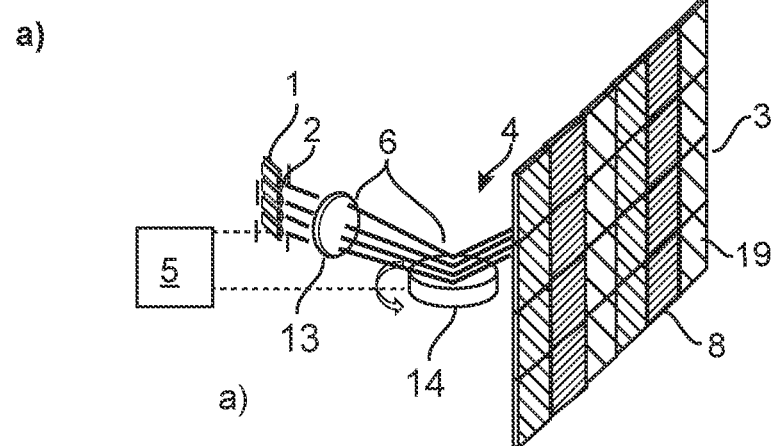
Figure 11:
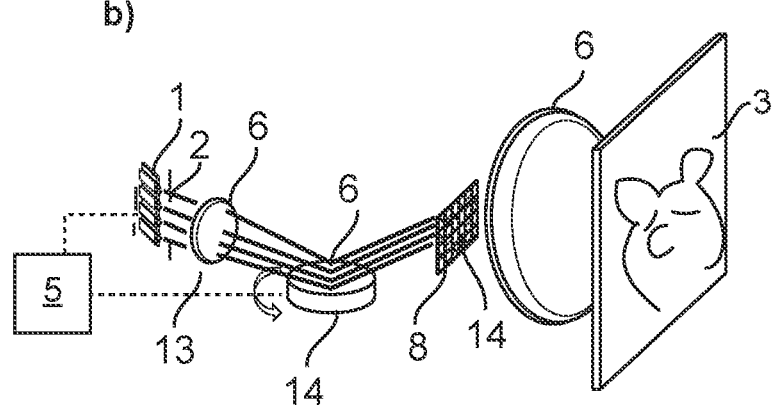

FIG. 11 again shows two different embodiments of the invention, each of which can be used to display a plurality of pixels on an object surface 3, in this case a video screen.

A laser bar component is again used as the radiation source 1, whereby according to the embodiment shown in FIG. 11a), individual partial areas or pixels 19 of the video screen comprise a converter material, by the excitation of which the respective desired colour is displayed in the partial area. Depending on the laser bar used, images or patterns with up to 20, 50, 100 or 200 pixels, which can be controlled individually, can thus be generated. In this context, it is conceivable that the large visible partial areas or pixels 19 of the display are irradiated directly by the laser with the interposition of suitable optical elements 6 for beam guidance and/or beam shaping.

Alternatively, as shown in FIG. 11b), smaller pixels 19 of a screen, which are also provided with converter material, can be irradiated and then the differently coloured light emitted by these can be directed by means of an additional optical element 6 onto a larger video screen or screen provided as the object surface 3.

In general, combinations of individual or all technical features of the two previously described embodiment examples are again conceivable in this case. In particular, it is conceivable to vary the size of the object surface 3 onto which an image, lettering or pattern is projected over a wide range. For example, the invention could be used to display an image, lettering and/or pattern on a display of a telephone, in particular a cell phone or smartphone.

The invention claimed is:

1. A device for projecting a plurality of radiation points onto an object surface with at least one radiation source, which comprises a plurality of emitters for emitting electromagnetic radiation, with at least one radiation path, via which the electromagnetic radiation emitted at least temporarily by the plurality of emitters is directed in the direction of the object surface, and with a controller which, in order to change at least one property of the emitted electromagnetic radiation, controls the at least one radiation source in dependence on a light object to be generated on the object surface, wherein the controller is configured in such a way that at least two of the plurality of emitters of the at least one radiation source are each individually controlled for changing at least one property of the emitted electromagnetic radiation in dependence on the light object to be generated, and in that at least one optical element is arranged in the radiation path for shaping, directing and/or converting the electromagnetic radiation, the at least one optical element comprising at least one collimating lens, and characterized in that at least two of the plurality of emitters are individually controllable and electrically conductively connected to a common electrode, and wherein at least one converter element having a converter material is arranged in the radiation path, which, due to an excitation by the electromagnetic radiation, emits light having a wavelength different from the wavelength of the electromagnetic radiation causing the excitation, and wherein the at least one optical element is arranged downstream of the at least one converter element, and wherein the at least one collimating lens and/or the at least one converter element is arranged directly on the radiation source, and wherein the at least one converter element is integrated into the radiation source.

2. The device according to claim 1, characterized in that least two of the plurality of emitters are part of a laser bar.

3. The device according to claim 1, characterized in that at least two of the plurality of emitters are arranged spaced apart and along a line in a vertical or horizontal plane.

4. The device according to claim 1, characterized in that at least two planes, in each of which a plurality of emitters are arranged along a line, are arranged parallel to each other.

5. The device according to claim 1, characterized in that at least one of the plurality of emitters emits light with a wavelength between about 380 and 490 nm.

6. The device according to claim 1, characterized in that at least one of the plurality of emitters emits green, red, yellow or blue light.

7. The device according to claim 1, characterized in that the at least one converter element emits red, green, yellow or blue light.

8. The device according to claim 1,
characterized in that
the object surface comprises, at least in regions, a converter material which, due to an incident radiation having a first wavelength, emits radiation having a second wavelength different from the first wavelength.

9. The device according to claim 1,
characterized in that at least a part of the controller is designed as belonging to an integrated circuit.

10. The device according to claim 9,
characterized in that
the integrated circuit is arranged in or on a heat sink through which heat is at least temporarily dissipated from at least one of the plurality of emitters.

11. The device according to claim 1,
characterized in that
at least one of the plurality of emitters emits light having at least one wavelength in the infrared spectral range, in particular in the near-infrared spectral range, and/or
wherein the at least one converter element emits light having at least one wavelength in the infrared spectral range, in particular in the near-infrared spectral range.

12. The device according to claim 1,
characterized in that
at least one of the plurality of emitters emits light having one wavelength and at least one other emitter of the plurality of emitters emits light having another wavelength, wherein the difference between the two wavelengths is smaller than a predetermined difference value, and/or
wherein at least two converter elements having a respective converter material are arranged in the radiation path, which due to excitation by the electromagnetic radiation emit light with a wavelength which is different from the wavelength of the electromagnetic radiation causing the excitation, wherein one of the converter elements emits light having at least one wavelength, and wherein the other converter element emits light having a different wavelength, wherein the difference between the two wavelengths is smaller than a predetermined difference value.

13. A method for projecting a plurality of radiation points onto an object surface,
in which
a plurality of emitters of a radiation source at least temporarily emit electromagnetic radiation, wherein at least two of the plurality of emitters are individually controllable and electrically conductively connected to a common electrode, the electromagnetic radiation emitted by the emitters is directed via a radiation path in the direction of the object surface, and
the radiation source is controlled with the aid of a controller in such a way that at least one property of the emitted electromagnetic radiation is changed at least temporarily in dependence on a light object to be generated on the object surface, characterized in that
the controller controls at least two of the plurality of emitters of the radiation source, respectively, in such a way that at least one property of the emitted electromagnetic radiation is changed in dependence on the light object to be generated, and
in that the electromagnetic radiation in the radiation path is shaped, directed and/or converted by at least one optical element, the at least one optical element comprising at least one collimating lens,
wherein at least one converter element having a converter material arranged in the radiation path, which, due to an excitation by the electromagnetic radiation, emits light having a wavelength different from the wavelength of the electromagnetic radiation causing the excitation, and
wherein the at least one optical element is arranged downstream of the at least one converter element, and wherein the at least one collimating lens and/or the at least one converter element is arranged directly on the radiation source, and wherein the at least one converter element is integrated into the radiation source.

14. The method according to claim 13,
characterized in that
a radiation power and/or a radiation intensity of the electromagnetic radiation emitted by at least one emitter is changed.

15. The method according to claim 13,
characterized in that
the controller controls at least one of the plurality of emitters in such a way that a radiation direction and/or a radiation angle of the emitted electromagnetic radiation is changed.

16. The method according to claim 13,
characterized in that
the controller controls at least one optical element arranged in the radiation path in such a way that a change in a radiation impinging on the optical element caused by the optical element is varied.

\* \* \* \* \*